United States Patent [19]

Bornert

[11] Patent Number: 5,570,020

[45] Date of Patent: Oct. 29, 1996

[54] MR METHOD AND DEVICE FOR CARRYING OUT SUCH A METHOD

[75] Inventor: Peter Bornert, Hamburg, Germany

[73] Assignee: U.S. Philips Corporation, New York, N.Y.

[21] Appl. No.: 544,503

[22] Filed: Oct. 18, 1995

[30] Foreign Application Priority Data

Oct. 28, 1994 [DE] Germany ........................ 44 38 488.2

[51] Int. Cl.⁶ ............................................. G01V 3/00
[52] U.S. Cl. ................................... 324/309; 128/653.2
[58] Field of Search ............................ 324/300, 307, 324/309, 310, 311, 312, 313, 314, 318, 322; 128/653.2

[56] References Cited

U.S. PATENT DOCUMENTS 5,138,259  8/1992  Schmitt et al. ..................... 324/309

5,510,711  4/1996  Molyneaux et al. ................. 324/309

FOREIGN PATENT DOCUMENTS 0490528  6/1992  European Pat. Off. .
0644437  2/1995  European Pat. Off. .
4005675  8/1991  Germany .

OTHER PUBLICATIONS

"Phase Correction for EPI Using Internal Reference Lines" A. Jesmanowicz et al, SMRM Book of Abstracts, Aug. 1993, p. 1239.

*Primary Examiner*—Michael Tokar
*Attorney, Agent, or Firm*—Jack D. Slobod

[57] ABSTRACT

A number of MR signals are successively acquired in a sequence under the influence of a read gradient of alternating polarity to produce MR raw data, and ghost images are avoided by correcting the MR raw data using MR correction data derived from MR signals acquired during the same sequence.

7 Claims, 3 Drawing Sheets

MR METHOD AND DEVICE FOR CARRYING OUT SUCH A METHOD

BACKGROUND OF THE INVENTION

1. Field of the Invention

The invention relates to an MR method, including:

(a) excitation of nuclear magnetization in an examination zone, subject to a uniform, steady magnetic field, by means of a sequence containing at least one RF pulse, (b) subsequent generation of a read gradient of alternating polarity and simultaneous generation of a phase encoding gradient, (c) acquisition of MR signals occurring after the polarity reversal of the read gradient in order to acquire MR raw data, (d) correction of the MR raw data by means of MR correction data derived from MR signals acquired in the same sequence and with the same temporal variation of the read gradient, however, without phase encoding, and (e) reconstruction of the nuclear magnetization distribution from the corrected MR raw data. The invention also relates to an MR device figured for carrying out such method.

2. Description of the Related Art

It is known that when an MR method in which a plurality of MR signals are successively acquired with an alternating polarity of the read gradient is used, imperfections of the MR system cause phase errors which themselves cause so-called N/2 ghost images.

In order to avoid such artifacts, in an MR method which is known from EPO 490 528 41 in addition to a first sequence, during which the MR raw data are acquired, there is executed a second sequence during which, in the absence of a phase encoding gradient, exactly as many MR signals during the first sequence are acquired as in order to derive MR correction data therefrom. The measuring time is thus doubled. Moreover, the two sequences must be spaced apart in time by an amount which suffices to allow for the nuclear magnetization excited by the first sequence to decay before the second sequence commences. This period of time is of the order of magnitude of one second. A possibly necessary waiting period and the increased measuring period are disadvantageous notably when real-time applications are concerned, for example when the nuclear magnetization distribution is determined continuously in different slices whose orientation changes continuously and which do not extend parallel to one another.

This drawback is avoided by the method which is known from an article by Jesmanowicz et al. entitled "Phase Correction for EPI Using Internal Reference Lines" in *SMRM Book of Abstracts* August, 1993, p. 1239. Therein, the correction data are derived from two MR signals which successively occur with positive and negative polarity in the course of an EPI sequence when the time integral over the phase encoding gradient has reached the value zero. From these two MR signals there can be derived correction data for the MR raw data acquired with positive polarity of the read gradient on the one hand and with negative polarity of the read gradient on the other hand. However, this method offers satisfactory results only if the phase errors do not vary in time. In the case of a locally inhomogeneous steady magnetic field, however, phase errors occur which vary in time and which cannot be eliminated by means of the known MR method, so that the N/2 ghost images occur as before. Moreover, phase errors induced by eddy currents cannot be detected either.

SUMMARY OF THE INVENTION

It is an object of the present invention to conceive a method of the kind set forth in such a manner that on the one hand the acquisition of the necessary MR signals is sufficiently fast and that on the other hand the phase errors, or the image artefacts resulting therefrom, can be suppressed to a very high degree.

This object is achieved in accordance with the invention in that with positive polarity and with negative polarity of the read gradient ($G_x$) overall at least three MR signals which have not been influenced by the phase encoding gradient ($G_y$) are acquired and that the MR correction data are derived from these MR signals or the MR data obtained therefrom by Fourier transformation.

In accordance with the invention, the MR signals wherefrom the MR correction data are derived are acquired during the same sequence as that in which there are acquired the phase-encoded MR signals wherefrom the image of the nuclear magnetization distribution is reconstructed after the correction. With positive and negative polarity of the read gradient overall at least three MR signals are acquired without phase encoding. This enables, for example the elimination of phase errors caused by eddy current effects.

In the case of phase errors which vary in time correction is possible in that the phase error variation (for example, $\alpha(t_1,x)$, $\alpha(t_3,x$ of these MR signals, or of the MR data ($S(t_1,x)$, $S(t_3,x)$) derived therefrom by Fourier transformation, is determined, and that from the temporal variation ($da_0$, $da_1$; $db_0$, $db_1$) of phase error variations ($\alpha(t_1,x)$, $\alpha(t_3,x)$) associated with the same polarity of the read gradient there is estimated the phase error variation ($\alpha(t_1,x)$) of MR signals acquired with this polarity of the read gradient at another instant (t), or of MR raw data ($S(t,x)$) derived therefrom, and the MR raw data are corrected accordingly.

This is because it has been found that, generally speaking, the phase error variations detected with the same polarity of the read gradient but at different instants also deviate from one another. The phase error variation occurring for an MR signal acquired at a different instant within the sequence with phase encoding can be estimated from said temporal variations, for example by linear or quadratic interpolation or extrapolation, and the MR raw data can be corrected accordingly. When a linear variation of the phase variation in time is assumed, which usually is correct, with positive as well as with negative polarity of the read gradient each time (at least) two MR signals without phase encoding must be taken into account and (at least) three MR signals in the case of a temporal quadratic variation.

Even if the phase errors of the MR raw data were completely eliminated, ghost images could still occur, that is when the frequency response of the MR system carrying out the method of the invention is unsymmetrical relative to the center frequency of the MR signals. These image artefacts can be eliminated according to a preferred version of the invention in that correction factors are derived from the MR data and that the MR raw data acquired with the same polarity of the read gradient are multiplied by these correction factors. It is to be noted that the effect of the frequency dependency of the MR system, its effects on the MR images as well as the elimination of these effects are known from DE-OS 4 005 675 which corresponds to U.S. Pat. No. 5,138,259. However, therein always two sequences must be carried out, one with and one without phase encoding gradients.

In a further version of the invention, the sequence comprises a correction time interval in which the MR signals used to form the MR correction data are acquired during a read gradient of alternating polarity without phase encoding, and subsequently at least one measuring time interval in which the MR signals used to form the measuring data are acquired during a read gradient of alternating polarity and under the influence of a phase encoding gradient. The MR signals wherefrom the MR correction data are derived then exhibit the best signal-to-noise ratio of all MR signals within the sequence, because they are situated at the shortest distance from the RF pulse.

In a further version of the invention, the sequence comprises an RF pulse which excites the nuclear magnetization, succeeded by an RF pulse which refocusses the nuclear magnetization, the correction time interval being situated between the two RF pulses whereas the measuring time interval succeeds the refocussing RF pulse. The correction time interval could in principle also be situated between the refocussing RF pulse and the measuring time interval, but it is more effective for the correction time interval to be situated between the two RF pulses.

An MR apparatus for carrying out the method of the invention, comprising:

a) a main field magnet for generating a uniform, steady magnetic field, b) a gradient coil system for generating a read gradient of alternating polarity and for generating a phase encoding gradient, c) an RF coil system for exciting the nuclear magnetization in the examination zone by means of a sequence comprising at least one RF pulse, d) a receiver for receiving the MR signals generated during the read gradient, e) means for correcting the MR raw data, generated from the MR signals, by means of MR correction data derived from MR data without phase encoding, f) a reconstruction unit for reconstructing the nuclear magnetization distribution in the examination zone from the corrected MR measuring data, g) a control unit for controlling the gradient coil system, the RF coil system and the receiver is characterized in that the control unit controls the gradient coil system and the receiver in such a manner that the temporal variation of the read gradient and of the phase encoding gradient during the sequence is such that each time during two or three time intervals with positive as well as with negative polarity of the read gradient a respective MR signal is acquired which has not been influenced by the phase encoding gradient and which is used for deriving the MR correction data.

BRIEF DESCRIPTION OF THE DRAWINGS

The invention will be described in detail hereinafter with reference to the drawings. Therein.

DETAILED DESCRIPTION OF THE PREFERRED EMBODIMENTS

Figure 1:
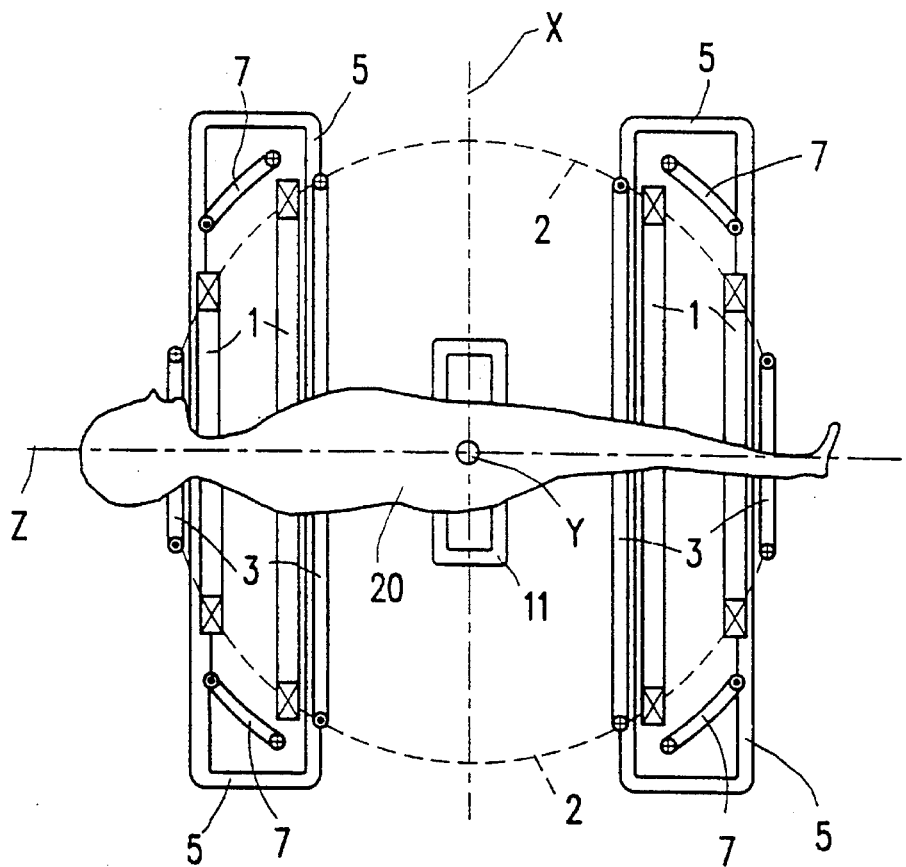
FIG. 1 shows an MR tomograph which is suitable for carrying out the invention.

The MR apparatus which is diagrammatically shown in FIG. 1 comprises a main field magnet which consists of four coils 1 and which generates a uniform, static magnetic field whose magnetic induction may be of the order of magnitude of from some tenths of tesla to some tesla. The patient 20 to be examined is arranged on a table top 4 positioned inside the main field magnet.

Four coils 3 are arranged on the surface 2 of a sphere in order to generate a magnetic field $G_z$ which extends in the z direction and which linearly varies in this direction. Also provided are four coils 7 which generate a magnetic field $G_x$ which also extends in the z-direction and which varies linearly in the x-direction (vertically). A magnetic field $G_y$ which extends in the z-direction and which varies linearly in the y-direction (perpendicularly to the plane of drawing of FIG. 1) is generated by four coils 5 which may be identical to the coils 7 but which are arranged so as to be offset 90° with respect thereto, only two of said coils being shown. For simplicity the magnetic fields generated by the gradient coils will be referred to hereinafter as "gradient" or, in conformity with their function, as "read gradient", "phase encoding gradient" or "slice selection gradient". Because each of the three coil systems 3, 5 and 7 is arranged symmetrically with respect to the spherical surface 2, the magnetic induction at the center of the sphere is determined exclusively by the static, uniform magnetic field of the main field magnet 1.

Figure 2:
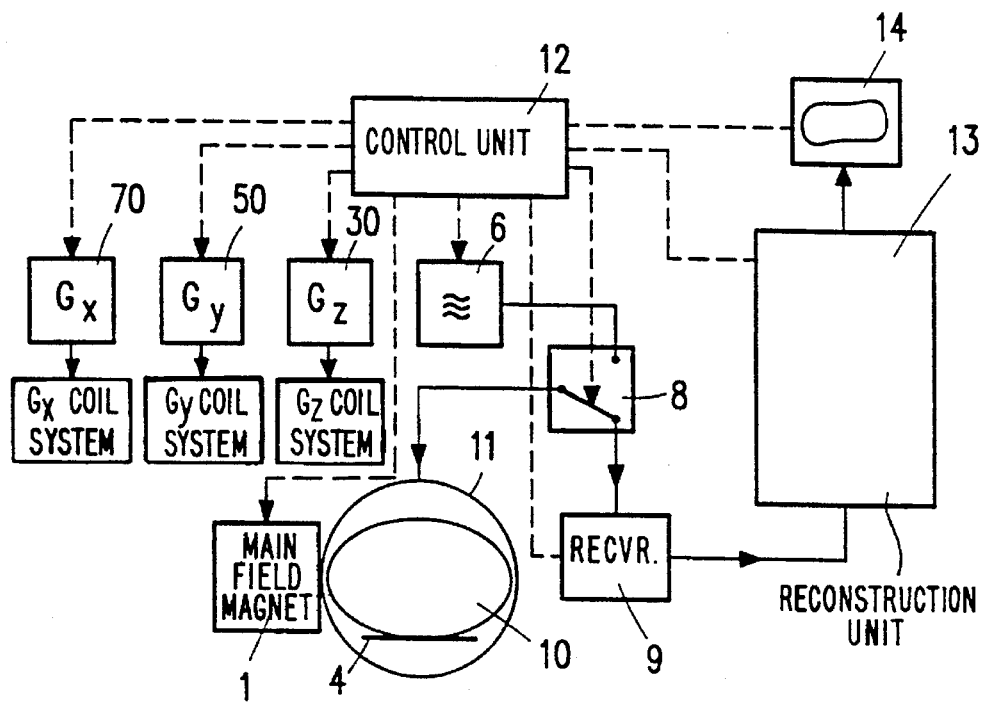
FIG. 2 shows the block diagram of such an MR tomograph.

There is also provided an RF coil 11 which generates an RF magnetic field which is essentially uniform and which extends perpendicularly to the direction of the static, uniform magnetic field (i.e. perpendicularly to the z-direction). As is shown in FIG. 2, via a switch 8 the RF coil 11 can be connected as desired to an oscillator 6 or to a receiver 9. In the position of the switch shown, the RF coil can be used for receiving the MR signals generated in the examination zone. However, for the reception of the MR signals it is also possible to use one (or more) separate RF receiving coils which are not shown in FIG. 1. In the receiver 9 the MR signals are detected in a phase-sensitive manner, followed by digitization so that the MR data supplied by the receiver may be considered as complex numbers (having an amount and a phase).

The position in time of the RF pulses, their bandwidth and their center frequency can be controlled by a control unit 12 which acts on the oscillator 6. The currents for the gradient coil systems 3, 5 and 7 are supplied by power supply units 30, 50 and 70 which themselves are controlled by the control unit 12 so that the variation in time of the gradients is also determined by the control unit 12. There is also provided a reconstruction unit 13 which processes the digitized MR signals transposed to the low-frequency range and which can reconstruct the nuclear magnetization distribution in the examination zone therefrom for reproduction on an output unit 14.

Figure 3:
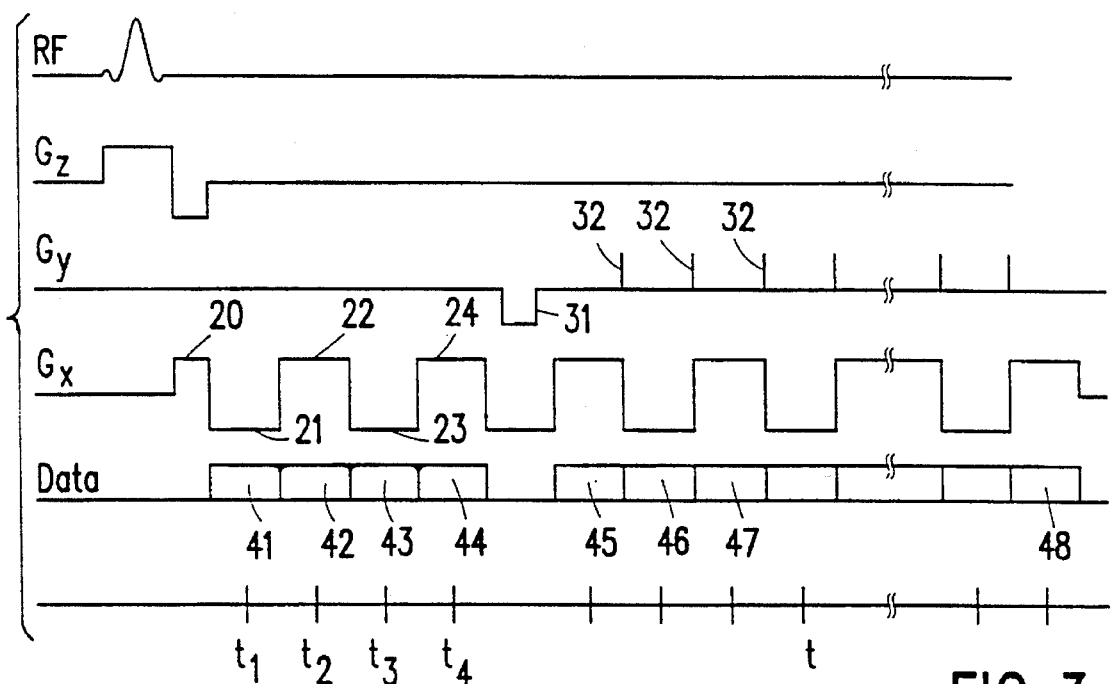
FIG. 3 shows the variation in time of various signals during the acquisition of the MR signals by means of a first sequence.

FIG. 3 shows the position in time of various signals in the case of a sequence of the EPI type modified in conformity with the invention. The first line shows the position in time of the RF pulse RF. The second to fourth lines show the variation in time of the slice selection gradient $G_z$, of the phase encoding gradient $G_y$ and of the read gradient $G_x$. In this respect it has been assumed that these gradients extend in the z-direction, the y-direction, and the x-direction; however, this is not necessary as the gradients can extend in an arbitrary direction in space, however, preferably perpendicularly to one another. Generation of a gradient having an arbitrary direction in space, however, implies that the units 30, 50 and 70 must be simultaneously activated so that the gradients of the coils 3, 5 and 7 are superimposed. The fifth line shows when the MR signals have been acquired or digitized, and on the sixth line some special instants are plotted on a time axis.

The sequence commences with a slice-selective 90° RF pulse, i.e. the RF pulse (first line) is accompanied by a slice selection gradient $G_z$ (second line), so that the nuclear magnetization in the examination zone is excited only in a slice extending perpendicularly to the z-axis.

Subsequent to the RF pulse, the read gradient $G_x$ is switched on; its polarity may first be positive (20), then negative (21), then positive again (22) etc. The variation in time is chosen so that the amount of the time integral between the zero crossings of the read gradient for the gradient pulse 20 equals exactly half of that for all subsequent gradient pulses 21, 22, 24. This means that upon reception of an MR signal during one of the subsequent positive or negative gradient pulses, the k-space describing the spatial frequency range is scanned along a straight line whose end points are situated at the same distance from the zero point of the k-space.

After the gradient has thus reversed its polarity four times until the gradient pulse 24, the phase encoding gradient $G_y$ is switched on and off (pulse 31) during the next pulse of the read gradient $G_x$, so that the phase of the MR signal generated during the next read gradient is encoded. Upon the zero crossing of the read gradient a short gradient pulse (a so-called "blip") 32 is generated, so that the phase encoding of the MR signal subsequently generated changes. In response to each further zero crossing of the read gradient, further blips 32 are generated. The blips 32 have a polarity which opposes that of the pulse 31 of the phase encoding gradient, and the time integral over the pulse 31 mounts to a multiple of the time integral over a blip 32; however, it is smaller than the sum of the time integrals over all blips 32.

In the time intervals which are denoted by the references 41, 42, 43 and 44 in FIG. 3, in which the read gradient does not change its polarity and whose centers are denoted by the references $t_1$, $t_2$, $t_3$ and $t_4$ in conformity with the sixth line of FIG. 3, each time a complete MR signal (or a so-called "gradient echo") is acquired. In the time intervals 41 and 43 the gradient pulse 21, 23 is always of negative polarity, and in the time intervals 42, 44 it (22, 24) has a positive polarity. Subsequent to the pulse 31 of the phase encoding gradient $G_y$, N MR signals are acquired during the time intervals 45, 46, 47 . . . 48, N being substantially larger than 4 and amounting to, for example 128.

The MR signals acquired during the time intervals 41 . . . 44 are completely free from phase encoding. In the ideal case, i.e. if the main magnetic field were completely homogeneous, if no relaxation phenomena were to occur and if the MR system were to have a frequency-independent transfer characteristic, these MR signals, or the data arising from Fourier transformation of the individual MR signals, should be identical. Because of the imperfections of the MR system and because of the relaxation phenomena, these MR signals, or the Fourier transforms derived therefrom, deviate from one another. Because these imperfections still exist after acquisition of the four MR signals, it is possible to derive therefrom MR correction data enabling correction of the MR raw data derived from the MR signals acquired during the time intervals 45 . . . 48.

Figure 4:
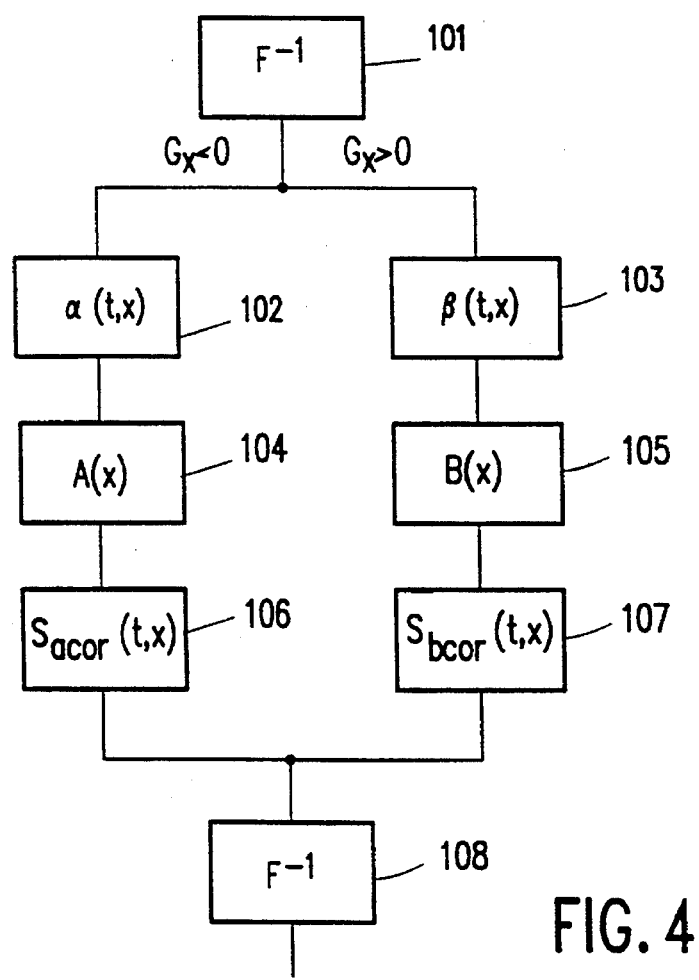
FIG. 4 shows a diagram illustrating the correction method.

To this end, in conformity with block 101 of FIG. 4, representing a part of the flow chart of the computer program executed in the reconstruction unit 13, each of the MR signals acquired during the time intervals 41 . . . 44 as well as 45 . . . 48 is subjected to a one-dimensional inverse Fourier transformation. As a result, the digital complex sampling values of the MR signal which are dependent on the time or the spatial frequency $k_x$ in the direction of the read gradient ($k_x$ is the time integral over the read gradient from the end of the RF pulse until the acquisition of the relevant sampling value in the MR signal) are converted into a series of again complex MR data $S(t,x)$. Therein, the value t denotes the position in time of the MR signal within the sequence, or the associated phase encoding, and the value x denotes a position in the x-direction (x is the direction of the read gradient). The MR data thus derived from the plurality of MR signals acquired during the time intervals 45 . . . 48 will be referred to as MR raw data hereinafter.

In an ideal MR system, the MR data $S(t_1,x)$ . . . $S(t_4,x)$ arising from the Fourier transformation of the first four MR signals acquired during the time intervals 41 . . . 44, should have the same phase for each instant and for each value x; however, this is not the case because of the imperfections of the MR system. The deviation of the relevant phase from the value zero will be referred to as "phase error" hereinafter. Therefore, the phase errors of the MR raw data are calculated in the blocks 102 and 103. Because the phase errors are also dependent on the polarity of the read gradient, different symbols will be used hereinafter: $\alpha$ for the phase errors with negative polarity and $\beta$ for the phase errors with positive polarity. The calculations of $\alpha$ and $\beta$ are completely analogous, so that hereinafter only the calculation of $\alpha$ will be dealt with.

The phase error is calculated from the imaginary part $Im(S(t_i,x))$ and the real part $Re(S(t_i,x))$ of the complex signal $S(t_i,x)$ produced by the Fourier transformation; $t_i$ characterizes the instant of acquisition of the associated MR signal, in accordance with the formula:

$$\alpha(t_i,x) = \arctan\left[\frac{Im(S(t_i,x))}{Re(S(t_i,x))}\right] \quad (1)$$

where arctan[] is the inverse function of the tangent function tan[]. Thus, for each signal $S(t_1,x)$ . . . $S(t_4,x)$ derived from the first four MR signals the phase can be derived as a function of the location x. Because the phase error is dependent on x, the term phase error variation will also be used for $\alpha(t_i,x)$ hereinafter.

Figure 6:
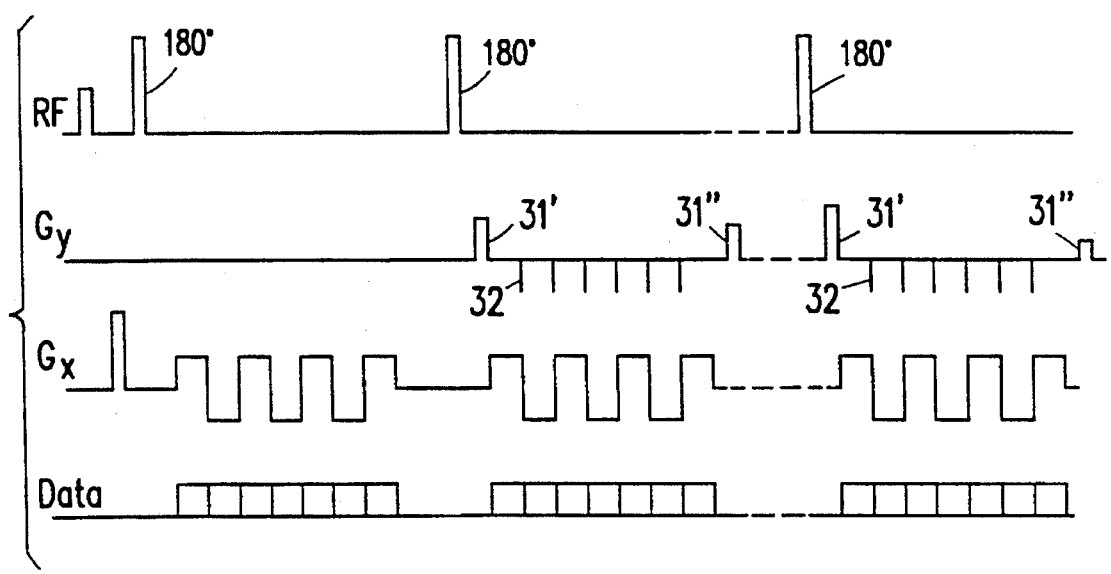
FIG. 6 shows a third version.

As is explained in EPO 490 528, FIG. 6, usually a linear dependency exists between the phase $\alpha$ and the location x. Accordingly, the phase error variation $\alpha(t_1,x)$ of the signal $S(t_1,x)$ derived from the first MR signal by Fourier transformation can be approximated as $$\alpha(t_1,x) \approx a_{01} + a_{11} \cdot x \quad (2)$$

Therein, $a_{01}$ is a coefficient which indicates the phase of the signal $S_1(x)$ at the location x=0 (the so-called constant phase) and $a_{11}$ is a coefficient which defines the linear variation of the phase as a function of x. Analogously, for the phase variation $\alpha(t_3,x)$ of the signal $S(t_3,x)$ derived from the MR signal occurring at the instant $t_3$ there is obtained $$\alpha(t_3,x) \approx a_{03} + a_{13} \cdot x \quad (3)$$

Even though the signals $S(t_1,x)$ and $S(t_3,x)$ stem from odd echos or from MR signals acquired each time with the same (negative) polarity of the read gradient $G_x$, notably because of inhomogeneities of the steady magnetic field generated by the main field magnet, the coefficients $a_{01}$ and $a_{03}$ on the one hand and $a_{11}$ and $a_{13}$ on the other hand may deviate from one another.

The invention is based on the recognition of the fact that said imperfections of the magnetic field lead to an essentially linear temporal variation of the coefficients $a_1 \ldots a_{13}$ in the equations (2) and (3). In conformity therewith, a linear extrapolation can be applied to determine the phase error variation $\alpha(t,x)$ incurred by the Fourier transform of a (phase-encoded) MR signal, acquired at a later instant, because of the imperfections. It holds that $$\alpha(t,x) = a_{01} + a_{11} \cdot x + (da_0 + da_1 \cdot x) \cdot \frac{t-t_1}{t_3-t_1} \quad (4)$$

where $$da_0 = a_{03} - a_{01} \text{ and } da_1 = a_{13} - a_{11} \quad (5)$$

Therein, t is the center of the interval in which the MR signal incurring the phase error variation $\alpha(t,x)$ is acquired, again with the negative read gradient (see sixth line of FIG. 3).

The determination of the phase error $\alpha(t,x)$ for the MR raw data acquired in conjunction with a negative read gradient in the block 122 can be summarized as follows:

a) The phase variations $\alpha(t_i,x)$ of the Fourier transform $S(t_i,x)$ are determined for those of the four MR signals acquired without phase encoding which have been acquired with the same (negative) polarity of the read gradient.

b) The phase variations thus determined are approximated by the linear set-ups in conformity with the equations (2) and (3).

c) From the coefficients $a_{01} \ldots a_{13}$ thus obtained, the phase error $\alpha(t,x)$ incurred by those phase-encoded MR signals, or their Fourier transform, which have been acquired with the same (negative) polarity of the read gradient are calculated in conformity with the equations (4) and (5).

In the block 103 the phase error variation $\beta(t,x)$, incurred by the MR signals (or their Fourier transform $S(t,x)$) arising with positive polarity of the read gradient $G_x$ are calculated by analogous application of the steps a) to c) or the equations (1) to (5) in conformity with the equation $$\beta(t,x) = b_{02} + b_{12} \cdot x + (db_0 + db_1 \cdot x) \cdot \frac{t-t_2}{t_4-t_2} \quad (6)$$

Therein, $b_{02}$ is the phase of the signal $S(t_2,x)$ acquired in the time interval 42 (with positive polarity of the read gradient) and subjected to a Fourier transformation for x=0, and $b_{12}$ characterizes the linear variation of this phase as a function of the location x. $t_2$ and $t_4$ represent the centers of the intervals 42 and 44, whereas $db_0$ and $db_1$ indicate the variation of these values in the time interval between $t_2$ and $t_4$. In this case the value t indicates the center of a time interval in which the read gradient is positive, for example the center of one of the time intervals 45 or 47.

Even if the phase errors $\alpha(t,x)$ and $\beta(t,x)$ present in the MR raw data were completely eliminated, ghost images could still occur, that is if the frequency response of the part of the system which processes the MR signals is not symmetrical relative to the center frequency of the MR signals, notably if the MR receiving coil is not tuned exactly to this center frequency. This is because such a frequency response influences the MR raw data $S(t,x)$, acquired with positive polarity of the read gradient in a manner other than the MR raw data acquired with negative polarity.

This frequency dependency, however, can also be eliminated on the basis of the MR data $S(t_1,x) \ldots S(t_4,x)$ determined without phase encoding. The spectrum of the MR signals acquired without phase encoding gradient is influenced by the frequency response of the MR system. The same holds for the MR data $S(t_1,x) \ldots S(t_4,x)$ generated from these MR signals, MR data acquired with positive polarity of the read gradient are then influenced in a manner other than MR data acquired with negative polarity of the read gradient. Consequently, from these MR data there can be derived correction factors $A(x)$ and $B(x)$ whereby the effect of the frequency dependency on the MR raw data $S(t,x)$ can be eliminated. Different set-ups are feasible for the calculation of the correction factors $A(x)$ and $B(x)$.

According to a first set-up the correction factors $A(x)$ and $B(x)$ are determined as follows $$A(x) = \frac{|S_b(x)|}{|S_a(x)|} \text{ and } B(x) = 1 \quad (7)$$

Therein, $|S_a(x)|$ or $|S_b(x)|$ is the amount of $S_a(x)$ or $S_b(x)$. $S_a(x)$ represents the Fourier transform of one of the two MR signals acquired with negative polarity of the read gradient (i.e. it corresponds to $S(t_1,x)$ or $S(t_3,x)$. $S_b(x)$ represents $S(t_2,x)$ or $S(t_4,x)$, acquired with positive polarity of the read gradient, without phase encoding.

When the MR raw data $S(t,x)$ acquired with negative polarity of the read gradient are multiplied by the factor $A(x)$ and the MR raw data acquired with positive polarity of the read gradient are multiplied by the factor $B(x)$ in conformity with the equation (7), the frequency-dependent transfer function has the same effect on the resultant product, so that the ghost images disappear but the frequency dependency remains.

More attractive results are obtained by means of a second set-up where $A(x)$ and $B(x)$ are calculated as follows:

$$A(x) = \frac{1}{2} \cdot \frac{|S_a(x)| + |S_b(x)|}{|S_a(x)| + \delta} ; \quad (8)$$

$$B(x) = \frac{1}{2} \cdot \frac{|S_a(x)| + |S_b(x)|}{|S_b(x)| + \delta}$$

Therein, $\beta$ is a regularization parameter which avoids numerical discontinuities in the case of MR data containing a large amount of noise. Multiplication of the MR raw data by the correction factors $A(x)$ and $B(x)$ in conformity with the equation (8) not only avoids ghost images, but also eliminates substantially the effects of the frequency dependency on the raw data thus corrected.

After the correction factors $A(x)$ and $B(x)$ have thus been calculated in the blocks 104 and 105 in conformity with the equation (7) or (8), from the MR raw data acquired with negative polarity of the read gradient corrected data $S_{cor}((t,x)$ can be calculated in the block 106 in conformity with the equation:

$$S_{acor}(t,x) = A(x) \cdot e^{-j\alpha(t,x)} \cdot S_a(x) \quad (9)$$

Analogously, the MR raw data acquired with positive polarity of the read gradient can also be corrected in the block 107 in conformity with the equation:

$$S_{bcor}(t,x) = B(x) \cdot e^{-j\beta(t,x)} \cdot S_b(x) \quad (10)$$

After the data sets $S_{bcor}(t,x)$ and $S_{acor}(t,x)$ arising with positive and with negative polarity have been combined so as to form a single data set, a further one-dimensional inverse Fourier transformation is performed on the data which are associated with the same value x but with a different instant t or with a different phase encoding (block 108); therefrom an image of the nuclear magnetization distribution in the slice excited by the slice-selective RF pulse is formed which does not contain N/2 ghost images.

When the time integral over the pulse 31 of the phase encoding gradient $G_y$ amounts to exactly an integer multiple of the time integral over a blip 32, the time integral over the phase encoding gradient $G_y$ for an MR signal then occurring equals zero (i.e. $k_y=0$). This means that this MR signal is free from any phase encoding. If in that case no blip were present for the next three polarity reversals of the read gradient, four MR signals free from all phase encoding could be acquired in the center of the sequence and the MR correction data could be derived therefrom. In that case it would no longer be necessary to acquire the four MR signals in advance and the phase encoding could commence sooner accordingly. A condition to be satisfied, however, is that the time integral over the phase encoding gradient until the instant of acquisition of the MR signals used for the formation of the MR correction data is exactly zero. A given drawback consists in that the signal-to-noise ratio of the MR signals obtained after the beginning of phase encoding is less favourable, because of their larger temporal distance from the RF excitation pulse, than that of the MR signals obtained prior to the beginning of phase encoding.

Instead of acquiring the four MR signals used for forming the MR correction data either before or after the beginning of phase encoding, it is also possible to acquire two of these MR signals before and two of these MR signals after the beginning of phase encoding, i.e. each time one with positive and one with negative polarity of the read gradient. The phase differences $da_0$ and $da_1$ (equation 4) or $db_0$ and $db_1$ (equation 6) are then increased, which benefits the accuracy of the calculation of $\alpha(t,x)$ and $\beta(t,x)$.

In most cases the set-up contained in the equations (4) and (6), based on a linear temporal dependency of the coefficients $a_{01} \ldots a_{13}$ or $b_{02} \ldots$ etc. describing the location dependency, suffices to compensate the N/2 ghost images. In the case of large inhomogeneities of the static main magnetic field, temporally non-linear variations may appear which can be taken into account by way of a quadratic temporal set-up. To this end, the phase error variations of (at least) three MR signals acquired with the same polarity of the read gradient should be determined. The coefficients of the quadratic temporal set-up are then determined in such a manner that the temporal dependency of the phase error variations determined therefrom correspond as well as possible with to temporal dependency measured for these MR signals.

For the equations (2) and (3) it has been assumed that the phase error variation, i.e. the spatial dependency of the phase error, can be taken into account by way of a linear set-up; this usually suffices. Should such a set-up, being linearly dependent on x, not be sufficient, a phase variation of higher order can be approximated, it again being assumed that the coefficients determined individually are linearly (or quadratically) dependent on time.

Figure 5:
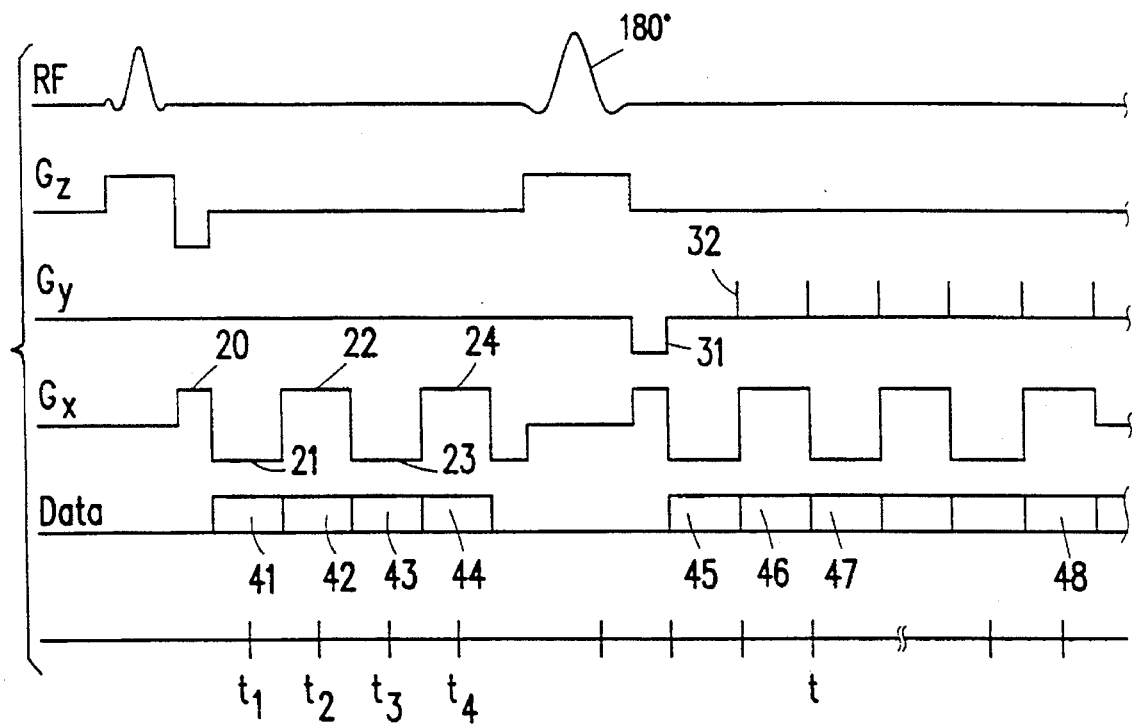
FIG. 5 shows a second version of a sequence in accordance with the invention.

FIG. 5 shows a further EPI sequence modified in accordance with the invention. It deviates from the sequence shown in FIG. 3 in that the slice-selective RF pulse is succeeded by a slice-selective 180° RF pulse. It is advantageous when the four MR signals without phase encoding are acquired in the time interval between the two RF pulses instead of after the 180° RF pulse. The refocusing 180° pulse inverts all phases, i.e. also all phase errors. This inversion may be considered as mirror imaging of the time axis. The new time base thus obtained must be considered as a shift in the equations (4) and (6) for prediction of the phase errors of the Fourier transforms of the subsequently measured MR raw data $S(t,x)$. FIG. 6 shows a version of the known GRASE sequence in the sense of the invention. The temporal variation of the slice-selective gradient is not shown.

A GRASE sequence is known to comprise, in addition to a first 90° RF pulse which influences the nuclear magnetization in the slice to be excited, a series of refocusing 180° RF pulses. For instance, between every two 180° RF pulses a preferably odd number of MR signals is acquired in conjunction with an alternating read gradient $G_x$. Between the first two refocusing 180° RF pulses no phase encoding is applied. Subsequent to the second and all further 180° RF pulses there is applied a pulse 31' of the phase encoding gradient, which pulse is succeeded by a series of blips 32 in synchronism with the read gradient. After the blips and prior to the next 180° pulse there is applied a further pulse 31" which is proportioned so that the time integral over the phase encoding gradient between two 180° pulses has a constant value, preferably the value zero. The number of polarity reversals of the read gradient between the first two pulses should be exactly equal to their number between all further RF pulses. However, only four of the MR signals without phase encoding which arise in the first interval need be evaluated, for example the first two and the last two MR signals.

It has been described in the foregoing how the time-dependent phase errors can be corrected for positive and negative polarity of the read gradient and how the receiver and receiver coil characteristic can be corrected by means of an amplitude factor. However, it is also possible to correct phase errors caused by eddy currents.

To this end, a sequence is used, for example the sequence shown in FIG. 6, which comprises (at least) three MR signals without phase encoding subsequent to a refocusing 180° pulse. The center of the second MR signal $t_2$ should then coincide with the instant of refocusing of the nuclear magnetization, i.e. the distance in time between this MR signal and the refocusing 180° pulse must be equal to its distance from the preceding 90° excitation pulse. It is also assumed that before that (at the instant $t_1$) and after that an MR signal should be acquired, the read gradient at the instant $t_1$ and that at the instant $t_3$ presumably having the opposite polarity with respect to that at the instant $t_2$. Moreover, the distance in time between $t_1$ and $t_2$ should be exactly equal to that between $t_2$ and $t_3$.

The following then holds as regards the phase errors for the MR data $S(t_1,x)$, $S(t_2,x)$ and $S(t_3,x)$ derived from these three signals by Fourier transformation: the phase errors are composed of a component $v(x)$, imposed by the magnetic field inhomogeneities or off-resonance effects, and a component $\epsilon(x)$ which is caused by eddy current effects. Because of the refocusing at the instant $t_2$, magnetic field inhomogeneities do not have an effect on the phase errors of $S(t_2,x)$. In the MR data $S(t_1,x)$ and $S(t_3,x)$ $v(x)$ is equally large; however, it has the opposite sign because the distance in time between the three successive MR signals is the same. The phase errors induced by eddy currents are also of the same absolute value in all MR data $S(_1,x) \ldots S(t_3,x)$, but their signs change in dependence on the read gradient active during the acquisition of the associated MR signal. The resultant phase errors for the three projections can thus be indicated as follows:

$$\phi(t_1, x) = -v(x) - \epsilon(x) \tag{11}$$

$$\phi(t_2, x) = +\epsilon(x) \tag{12}$$

$$\phi(t_3, x) = +v(x) - \epsilon(x) \tag{13}$$

By suitable multiplication of the MR data the terms $\sigma(x)$ and $\epsilon(x)$ can be isolated for use as correction. The product $P(x)$, calculated in conformity with the formula $$P(x) = S(t_1, x)\, S^*(t_2, x)\, S(t_3, x)\, S^*(t_2, x) \quad (14)$$

the term $S^*(t_2,x)$ indicates the conjugate complex value of $S(t_2,x)$), has a phase which can be determined, analogously to the equation (1), and which corresponds to four times the phase error $\epsilon(x)$, the value thus found being substantially independent of delay times in the generating of the read gradient. The phase error caused by the magnetic field inhomogeneities can be determined, for example from the product $S(t_1,x)$, $S^*(t_3,x)$.

I claim:

1. An MR method, comprising the following steps:

executing a sequence for producing MR signals in at least a region of an object under examination located in an examination zone which is subject to a uniform, steady magnetic field, said sequence comprising generating an RF excitation pulse for exciting nuclear magnetization in the region of the object, subsequently generating a read gradient having successive polarity reversals and a phase encoding gradient for affecting the evolution of the excited nuclear magnetization into MR signals, the phase encoding gradient being generated such that MR signals occurring after at least three of the polarity reversals are not influenced by the phase encoding gradient, the MR signals not influenced by the phase encoding gradient including at least one MR signal occurring during a positive polarity of the read gradient and at least one MR signal occurring during a negative polarity of the read gradient, whereas the MR signals occurring after the balance of the polarity reversals are influenced by the phase encoding gradient and thereby constitute a set of MR raw data, said set of MR raw data being subject to a phase error;

acquiring the set of MR raw data and the MR signals not influenced by the phase encoding gradient;

deriving MR correction data from the acquired MR signals not influenced by the phase encoding gradient;

applying the MR correction data to the acquired set of MR raw data to produce a set of MR raw data which is corrected for said phase errors; and reconstructing a nuclear magnetization distribution of a region of the object from the corrected set of MR raw data.

2. An MR method as claimed in claim 1, wherein the set of MR raw data comprises a first subset acquired with one polarity of read gradient and second subset acquired with the other polarity of the read gradient, the MR correction data is derived by determining two phase error variations, each applicable to a different associated one of the first and second subsets of MR raw data, and the MR correction data is applied by utilizing the determined phase error variations in correcting the applicable subsets of MR raw data.

3. An MR method as claimed in claim 1, wherein the set of MR raw data comprises a first subset acquired with one polarity of read gradient and second subset acquired with the other polarity of the read gradient, the MR correction data is derived by determining two correction factors, each applicable to a different one of the first and second subsets of MR raw data, and the MR correction data is applied by multiplying the first and second subsets of MR raw data by the applicable correction factors.

4. An MR method as claimed in claim 1, wherein the sequence comprises a correction time interval in which the MR signals not influenced by the phase encoding gradient are acquired during a read gradient of alternating polarity, and subsequently at least one measuring time interval in which the MR signals constituting the set of MR raw data are acquired during a read gradient of alternating polarity and under the influence of the phase encoding gradient.

5. An MR method as claimed in claim 4, wherein the sequence further comprises a refocussing RF pulse which succeeds the excitation RF pulse for inverting the excited nuclear magnetization, the correction time interval being situated between the excitation and refocussing RF pulses, and wherein the measuring time interval succeeds the refocussing RF pulse.

6. An MR method as claimed in claim 4, wherein the excitation RF pulse is succeeded by a plurality of blocks, each of which comprises a respective refocussing RF pulse and a read gradient with a respective given number of polarity reversals, and wherein one of the blocks does not involve a phase encoding gradient whereas the other blocks involve a phase encoding gradient.

7. An MR apparatus comprising:

a) a main field magnet for generating a uniform, steady magnetic field;

b) a gradient coil system for generating a read gradient of alternating polarity and for generating a phase encoding gradient;

c) RF generating means including an RF coil system for applying RF pulses to the examination zone;

d) MR signal acquisition means including a receiver for acquiring MR signals generated in the examination zone during the read gradient;

e) a control unit for controlling the gradient coil system, the RF coil system and the receiver in such a manner that in a sequence during which nuclear magnetization is excited by at least one RF pulse and evolves into generated MR signals, the temporal variation of the read gradient and of the phase encoding gradient during the sequence is such that during at least two time intervals with positive polarity of the read gradient and during at least two time intervals with negative polarity of the read gradient respective MR signals are acquired which have not been influenced by the phase encoding gradient and which are used for deriving MR correction data and during a plurality of other time intervals of the sequence respective MR signals which constitute a set of MR raw data are acquired which have been influenced by the phase encoding gradient and are subject to phase errors;

f) means for correcting the set of MR raw data by means of MR correction data derived from MR data not influenced by the phase encoding gradient; and g) a reconstruction unit for reconstructing a distribution of nuclear magnetization in the examination zone from the corrected MR set of MR raw data.

* * * * *